United States Patent
McLeod et al.

(10) Patent No.: US 8,803,574 B2
(45) Date of Patent: Aug. 12, 2014

(54) GENERATING A TUNED FREQUENCY OUTPUT FROM A SIGNAL GENERATOR

(71) Applicant: Cambridge Silicon Radio Limited, Cambridge (GB)

(72) Inventors: Duncan Angus McLeod, Cambridge (GB); Michael John Story, Whittlesford (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/693,280

(22) Filed: Dec. 4, 2012

(65) Prior Publication Data

US 2014/0152354 A1 Jun. 5, 2014

(51) Int. Cl.
*H03L 7/06* (2006.01)

(52) U.S. Cl.
USPC .......................................... 327/156; 327/147

(58) Field of Classification Search
None
See application file for complete search history.

(56) References Cited

U.S. PATENT DOCUMENTS

| | | | | |
|---|---|---|---|---|
| 5,923,196 A * | 7/1999 | Okamoto | ....................... | 327/156 |
| 6,198,353 B1 | 3/2001 | Janesch et al. | | |
| 7,216,249 B2 * | 5/2007 | Fujiwara et al. | ............... | 713/501 |
| 7,298,218 B2 * | 11/2007 | Ghazali et al. | ................... | 331/16 |
| 8,502,575 B2 * | 8/2013 | Zhang | ........................... | 327/156 |
| 2001/0036240 A1 * | 11/2001 | Gossmann et al. | ............. | 375/376 |
| 2002/0145456 A1 * | 10/2002 | Kikuchi | ......................... | 327/156 |
| 2010/0085089 A1 * | 4/2010 | Weng et al. | .................... | 327/156 |
| 2012/0049907 A1 * | 3/2012 | Da Dalt et al. | ................. | 327/147 |

FOREIGN PATENT DOCUMENTS

GB 2455717 6/2009

OTHER PUBLICATIONS

GB Search Report issued in related GB Application No. 1301211.7, dated Apr. 16, 2014.

* cited by examiner

*Primary Examiner* — Cassandra Cox
(74) *Attorney, Agent, or Firm* — RatnerPrestia (57) ABSTRACT

A method of tuning the frequency of a generated signal to form an output signal including: forming the generated signal at a signal generator; comparing a feedback signal with a reference signal and generating a control signal in dependence on that comparison, wherein the feedback signal is generated using the output signal; and generating the output signal by performing a frequency-dividing operation in dependence on the generated signal and a dividing factor, wherein the dividing factor is determined in dependence on the control signal.

20 Claims, 5 Drawing Sheets

GENERATING A TUNED FREQUENCY OUTPUT FROM A SIGNAL GENERATOR

FIELD OF THE DISCLOSURE

The present invention relates to generating a frequency-tuned signal from a signal generator.

BACKGROUND

A common component in many wireless communication devices is the phase locked loop (PLL). Typical applications of PLLs include, for example, FM de-modulators for use in radio transceivers and frequency synthesizers for wireless communications devices for a variety of communications protocols, for example Bluetooth.

Broadly, a PLL is a circuit utilising feedback in order to control the frequency of a generated signal. PLLs can be used to generate an output signal with a frequency that is a multiple of the frequency of a reference signal. The multiple could be an integer multiple. Alternatively, the multiple could be an irrational multiple. Another common use of PLLs is to generate a signal with a frequency that tracks changes in frequency of a reference signal. When a PLL tracks the frequency of the reference signal and outputs a signal with a frequency that is a known multiple of that reference frequency, the PLL is said to be "locked" onto the reference signal.

Figure 1:
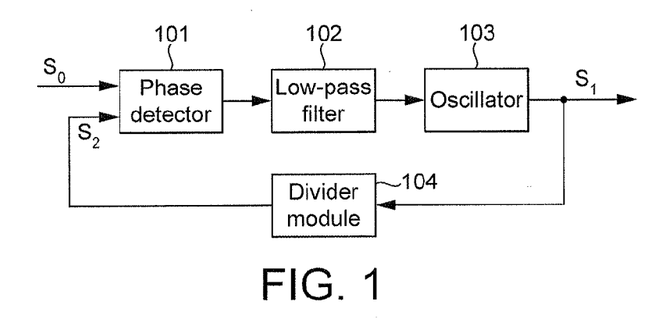
FIG. 1 is a block diagram of a conventional phase locked loop.

Typically, a PLL will contain some form of controllable oscillator responsive to an input signal and a phase detector for determining the phase difference between a reference signal and a signal generated from the oscillator. The phase detector will output a signal in dependence on the measured phase difference and this signal will be used to control the output of the oscillator. FIG. 1 shows a block diagram of an example PLL used to generate an output signal with a frequency which is an integer multiple of the frequency of a reference signal. In FIG. 1, a reference signal $S_0$ of frequency $F_0$ and a signal $S_2$ of frequency $F_2$ are input into a phase detector module 101. The phase detector module determines the phase difference between signals $S_0$ and $S_2$ and outputs an error signal in dependence on this difference into a low-pass filter (LPF) 102. The output signal of the Low-pass filter is a filtered error signal which is input into the control input of an oscillator 103. The oscillator outputs a signal $S_1$ with a frequency $F_1$ in dependence on the received input signal. The signal $S_1$ is input into a divider module 104. The output signal of the divider is the signal $S_2$, which is fed back into the phase detector module 101. If the phase difference between the reference signal and the output signal of the oscillator is held constant, or is zero, then the frequency of the output signal is fixed relative to the reference signal. This is known as phase-locking or frequency-locking.

Alternatively, a frequency detector can be used instead of a phase detector. A frequency detector outputs an error signal in dependence on the frequency difference between two input signals. If the frequency of the two input signals is equal (i.e., frequency locking has occurred), the frequency detector outputs a zero error signal. In contrast, a phase detector can output a finite, non-zero error signal when frequency locking has occurred.

Low pass filters (LPFs) such as LPF 102 in FIG. 1 are often used within PLLs to control the dynamics of the loop, such as, for example, how the loop responds to changes in the frequency of the input reference signal or changes at the divider. The cut-off frequency of the low-pass filter (i.e. the frequency of a signal where significant roll off starts to occur) affects what is known as the capture range. The capture range is defined as the band of frequencies over which the input signal frequency can vary and still cause the PLL to lock on from an unlocked state. Therefore in practice, it is often desirable to have a wide capture range so that lock-in can occur over a wide range of reference signal frequencies. The design of the low-pass filter is often a difficult task and depends on various factors. For example, if the cut-off frequency is too low the capture range will be decreased. However, a low cut-off frequency has the advantage that the PLL's response to input noise will be reduced and the response of the loop to sudden changes in input frequency (known as the transient response) will be damped.

A divider, such as divider 104 in FIG. 1, is used within a PLL to generate an output signal with a frequency which is a determined multiple of the reference signal frequency. The multiple could be a rational multiple or an irrational multiple depending on the type of divider. For a divider with a dividing factor N, the output frequency, $F_2$ is related to the input frequency, $F_1$, by the following equation:

$$F_2 = \frac{F_1}{N} \quad (1)$$

A simple description of the operation of a divider within a PLL now follows. An input signal $S_0$ of frequency $F_0$ is fed into a phase detector. The output signal from the phase detector is filtered and input into an oscillator which produces an output signal $S_1$ with frequency $F_1$. The signal $S_1$ is input into the divider which produces a signal $S_2$ with frequency $F_2$, such that $F_2$ is related to $F_1$ by the equation $F_2=F_1/N$. The signals $S_2$ and $S_0$ are then input into the phase detector which produces an error signal dependent upon the value of the phase difference between the two signals. Frequency is the time derivative of phase; therefore zero frequency difference between signals $S_2$ and $S_0$ corresponds to a constant phase difference, not necessarily equal to zero. If the phase detector measures a constant phase difference then the frequencies of the two input signals must be equal, that is, $F_0=F_2$. Since the frequency of the output signal $S_1$ of the oscillator is related to the frequency of the signal $S_2$ by the equation $F_1=F_2N$, the output signal of the oscillator is related to the input reference signal $S_0$ by the equation:

$$F_1=F_0N \quad (2)$$

I.e., the effect of a divider within a PLL is to produce an output signal which has a frequency which is a defined multiple of the frequency of the input reference signal.

PLLs can be implemented in either digital or analogue circuitry. An analogue PLL circuit typically utilises an analogue phase detector and a voltage controlled oscillator (VCO). A VCO is an electronic oscillator that generates an output signal with a frequency that may be varied by an applied DC voltage. The VCO has a gain, $K_v$, expressed in units of Hz/V. The output frequency $F_{out}$ of a VCO can be expressed in terms of the gain $K_v$ as:

$$F_{out}=F_c+K_v(V_{in}) \quad (3)$$

Here $V_{in}$ is the applied voltage to the VCO and $F_c$ is the VCO offset frequency.

A PLL with a digital phase detector is known as a digital PLL (DPLL). A DPLL may still implement a VCO as in an analogue PLL, but may employ digital phase detectors. In a typical digital phase detector the input signals are converted to digital level square waves and a counter is configured to increment a known amount at the passing of a rising edge of the input reference signal and decrement a possibly different known amount at the passing of a rising edge of the second input signal. The output of the counter, possibly after additional filtering, can drive a digital to analogue converter (DAC), and the output signal of the DAC could suitably be proportional to the integral of the phase difference between the two input signals. For example, the output of the counter could be input into a DAC, and the input or output of the DAC could be low-passed filtered.

In practical implementations of electronic circuits it is nearly always desirable to reduce the physical size of the circuit. The continued reduction in size of transistors and digital logic gates for use in integrated circuits has led to a drastic reduction in the size of digital circuits. A smaller circuit occupies a smaller amount of area on a chip and is hence cheaper to produce. Analogue circuits, on the other hand, do not scale down as effectively as components decrease in size which can lead to problems in integrating analogue and digital components on a single integrated circuit.

Problems arising from the integration of analogue and digital components onto a single integrated circuit include, for example, the non-linear relationship between the voltage and the oscillator frequency exhibited by a sub-micron VCO, and the coupling of digital noise to the noise-sensitive analogue components through the substrate. In addition, VCOs are susceptible to producing unwanted noise. This is because any noise present in an input signal will be amplified by the gain $K_v$ of the VCO and will translate into phase noise. To keep the phase noise at a minimum, it is therefore necessary to keep the gain $K_v$ as low as possible. However, it can be seen with reference to equation (3) that a large gain is required in order for the VCO to operate over a wide tuning range. Typically, these design conflicts are overcome by implementing multiple digitally selectable capture ranges, where a suitable capture range is selected using a selection mechanism. The use of a VCO on an integrated circuit therefore requires a large design effort to operate effectively and does not benefit from the continued reduction in size of digital components.

There is thus a need for improved integration between analogue and digital components for use within a PLL.

SUMMARY OF INVENTION

According to one aspect of the present invention there is provided a method of tuning the frequency of a generated signal to form an output signal comprising:
forming the generated signal at a signal generator; comparing a feedback signal with a reference signal and generating a control signal in dependence on that comparison, wherein the feedback signal is generated using the output signal; and generating the output signal by performing a frequency-dividing operation in dependence on the generated signal and a dividing factor, wherein the dividing factor is determined in dependence on the control signal.

Suitably the signal generator could have no inputs.

Suitably the frequency dividing operation comprises performing a plurality of frequency divisions on the generated signal, wherein in each of the plurality of frequency divisions the generated signal is frequency divided by an intermediary value such that the average of the intermediary values for the frequency dividing operation is equal to the dividing factor.

Suitably the frequency dividing operation is performed by a divider unit. The divider unit could comprise an error shaper. The divider unit could comprise a noise shaper.

Suitably the feedback signal and the reference signal are compared and an error signal is generated in dependence on that comparison. The error signal could be filtered and integrated to generate the control signal The control signal could be suitably input into the dividing unit to generate the dividing factor for use in the frequency dividing operation.

The method could further comprise: modulating the control signal to generate a modulated control signal; inputting the modulated control signal into the divider unit; generating a dividing factor in dependence on the modulated control signal; and generating the output signal by performing the frequency dividing operation in dependence on the dividing factor, wherein the output signal is modulated.

The feedback signal could be the output signal.

The output signal generated by performing the frequency dividing operation could suitably have a frequency equal to the frequency of the generated signal divided by the dividing factor.

The method could comprise: generating the output signal by performing the frequency dividing operation to generate a frequency-divided signal; inputting the frequency-divided signal into a phase locked loop (PLL); and forming the output signal at a signal generator within the phase-locked loop.

The frequency-divided signal could act as the reference signal of the phase locked loop.

The method could further comprise generating a plurality of output signals, wherein each of the said plurality of output signals is generated by performing a respective frequency dividing operation in dependence on the generated signal and a respective dividing factor.

The respective dividing factors for each of the plurality of output signals could suitably be determined in dependence on the control signal.

The control signal could suitably be modified to produce a plurality of modified control signals and each of the plurality of the modified control signals could be modulated and input into a respective divider unit to generate the respective dividing factor.

Each of the said plurality of output signals could suitably have a frequency equal to the generated signal divided by the respective dividing factor.

The method could comprise: generating a plurality of output signals, wherein each of the said plurality of output signals is generated by performing a respective frequency dividing operation; inputting each of the respective frequency divided signals into a respective phase locked loop; and forming each of the said plurality of output signals at a signal generator within the respective phase locked loop.

According to a second aspect of the present invention there is provided an apparatus for frequency tuning a generated signal to form an output signal comprising: a signal generator arranged to output the generated signal; a comparison unit arranged to compare a feedback signal with a reference signal and further arranged to generate an error signal in dependence on the comparison, wherein the feedback signal is dependent upon the output signal; and a frequency-divider unit arranged to perform a frequency dividing operation for generating the output signal in dependence on the generated signal and a dividing factor, wherein the dividing factor is dependent upon the error signal.

The divider unit could be arranged to: perform the frequency dividing operation for generating the output signal to generate a frequency-divided signal; and input the frequency-divided signal into a phase locked loop, wherein the phase locked loop comprises a signal generator configured to generate the output signal.

The apparatus could further comprise: a plurality of frequency-divider units for generating a plurality of output signals, wherein each of the plurality of frequency-divider units is configured to perform a frequency-dividing operation for generating one of the said plurality of output signals in dependence on the generated signal and a respective dividing factor, where each of the respective dividing factors is dependent on the error signal.

DESCRIPTION OF DRAWINGS

The invention will now be described by way of example with reference to the following drawings. In the drawings.

DETAILED DESCRIPTION

The apparatus described below provides a means of producing a frequency-tuned output signal from a signal generator. In particular, the frequency of the output signal can be tuned to a value pre-determined by the user and does not require the signal generator to be "locked" to a reference signal as is the case in conventional phase-locked loops (PLLs).

A common approach to generate a frequency-tuned output signal is to use a phase locked loop (PLL). A PLL comprises a feedback loop that compares the output from a controllable signal generator to a reference signal. Typically this is done by comparing the phase of the two signals. An error signal dependent upon the measured phase difference between the two signals is used to control the signal generator so that the output signal of the signal generator is brought into better phase alignment with reference signal. If the two signals are in phase alignment, or there is a constant phase difference between them, the two signals will be of the same frequency. The signal generator could take the form of an oscillator, for example a voltage controlled oscillator (VCO). A fundamental principle of the PLL is that an output signal with a desired frequency is produced by controlling an oscillator by way of a feedback signal. The input line into the oscillator is known as a "tune line". Suitably, the tune line is a wire. The tune line transmits a signal generated by suitable circuitry for controlling the frequency of the oscillator. In the exemplary PLL depicted in FIG. 1 the tune line transmits a signal generated by a phase detector, a divider module and a low pass filter. The tune line is a potential source of noise; for example with the circuit shown in FIG. 1 any noise generated in the phase detector, divider module or low pass filter will be present in the signal transmitted by the tune line.

PLLs may be implemented in either digital or analogue form. Analogue PLLs often contain a VCO. Certain digital PLL (DPLL) designs also contain a VCO along with suitable analogue-to-digital (ADC) and digital-to-analogue (DAC) converters. Since the output of an oscillator within a PLL is responsive to an input signal, the tune line within a PLL can be a source of noise: any noise present in the signal input into the oscillator will translate into an erroneous output signal. In practice it is therefore often desirable for the signals input into the oscillator to satisfy a suitably high level of accuracy. This places requirements on the components within a PLL that operate on the tune line, for example the phase detector or low-pass filter. In the situation where the oscillator is a VCO, the components on the tune-line will be analogue components. As has been described, although digital components are continually reduced in size due to the advance of integrated circuit technology, analogue components have not been scaled down with the same success. It would therefore be advantageous if the components responsible for the quality of the generated signal were implemented in the digital domain.

One approach to solve this problem is to frequency-divide the signal output from a signal generator (as in the case of conventional PLLs) and lock this frequency-divided signal in a digital control loop. That is, the output signal from the oscillator is locked, not the oscillator itself. This approach removes the signal generator from the control loop, meaning the signal generator can be free-running, i.e. the output of the signal generator is no longer dependent upon an input signal. Removing the signal generator from the control loop advantageously removes the requirement of a tune line and often substantial amounts of associated circuitry.

Figure 2:
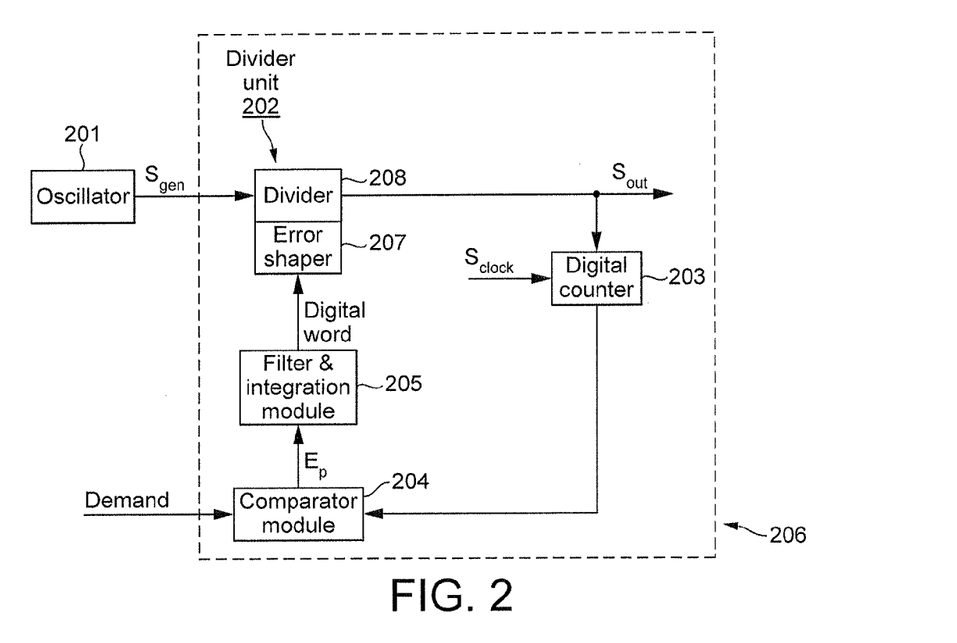
FIG. 2 is a block diagram of a circuit for producing a frequency-tuned output signal

FIG. 2 shows a schematic diagram of a circuit suitable for frequency tuning a signal generated by a signal generator to produce an output signal with a desired frequency. The following description will be made with reference to a signal generator comprising an oscillator. The apparatus and methods described herein are equally applicable to any suitable form of oscillator, for example a VCO or a current controlled oscillator (ICO). An ICO is a current controlled equivalent of a VCO. Generally, both VCOs and ICOs use tank circuits. Alternatively the oscillator could be a ring oscillator or a relaxation oscillator. Additionally, the following description will be made with reference to exemplary circuits in which the signal generator is freely oscillating, i.e. it does not have an input signal and therefore a tune line. This is for illustrative purposes only and it should be noted that the methods and apparatus described herein are equally applicable to a locked oscillator that has an input signal. In this case the output signal from the locked oscillator is frequency divided and locked in a digital control loop In more detail, FIG. 2 shows a circuit comprising an oscillator 201 configured to output a generated signal $S_{gen}$ with frequency $f_{gen}$. The oscillator could be, for example, an LC oscillator. Since oscillator 201 can be free-running, the frequency of signal $S_{gen}$ may vary in time. In practice, the output from the oscillator is converted into a signal with an approximate square-wave profile. This may be done by any suitable method, for example through the use of an op-amp or a comparator, or through binary logic gates. The apparatus required to generate a square wave from the output of the oscillator is omitted from the figures described herein for the purpose of clarity. In the following description, reference will be made to the signal $S_{gen}$ generated at the signal generator with the assumption that $S_{gen}$ has an approximate square-wave profile, i.e. that the analogue signal output from the oscillator has been converted into square-wave form.

The signal $S_{gen}$ is input into a frequency-divider unit 202. The frequency divider unit 202 is configured to frequency-divide the signal $S_{gen}$ to produce a signal $S_{out}$ with frequency $f_{out}$, related to the frequency $f_{gen}$ by the equation:

$$f_{out} = \frac{f_{gen}}{M} \quad (4)$$

In equation 4, M is a dividing factor and is used to define the relationship between the frequencies of the input and output signals of the frequency divider unit 202. The signal $S_{out}$ is the output signal of the circuit. As well as being output from the circuit, the signal $S_{out}$ is input into a digital counter 203. The digital counter 203 also has as an input a clock signal $S_{clock}$ with frequency $f_{clock}$. The output from digital counter 203 is fed back to a comparator module 204. The comparator could be, for example, a digital phase comparator. The digital phase comparator could suitably be a digitally implemented circuit. The output from the comparator module is an error signal $E_p$. Signal $E_p$ is input into a filter and integration module 205. The filter and integration module integrates and filters the error signal through a low-pass band and outputs a signal which is fed into the divider unit. The signal output from the filter and integration module is a digital word representative of the dividing factor M to be used by the divider. Since the value of M controls the frequency of the output signal, the signal output from the filter and integration module could be referred to as a 'control signal'. The value of M used by the divider unit is therefore dependent on an error signal. Suitably, the feedback circuit denoted by portion 206 operates to produce a value of M such that the error signal is minimised. Suitably, the error signal is configured such that if the error signal is zero, the frequency of the output signal $S_{out}$ is equal to a desired frequency, denoted by $f_{wanted}$ and this is achieved without affecting the frequency from the generator $f_{gen}$ The feedback portion 206 could suitably be implemented in the digital domain. With this implementation, the digital counter 203 could be configured to increment with the passing of a rising edge of the signal $S_{out}$. With the passing of each rising edge of the clock signal $S_{clock}$ the counter reading is cleared and the value of the reading held by the counter is sent as a digital feedback signal to the phase comparator 204. The phase comparator further receives as its input a digital signal representative of the value of the ratio of the desired frequency $f_{wanted}$ to the clock frequency $f_{clock}$. The frequency of the clock signal and the desired frequency are known, and therefore the ratio of $f_{wanted}$ to $f_{clock}$ is a known quantity, termed the 'demand'. This ratio can therefore suitably function as a reference signal for the system. The value of the demand can be made arbitrarily accurate with the level of accuracy dependent on the digital implementation used. The digital phase comparator compares the feedback signal output from the counter with the reference signal, and outputs an error signal $E_p$ in dependence on that comparison, for example the digital phase comparator could suitably operate to subtract the counter output from the demand.

In an alternative implementation the digital counter 203 could be configured to increment with the passing of each edge of the clock signal (i.e. both rising and falling edges). In this case the digital counter could be configured to clear its counter reading with the passing of each edge of the clock signal.

The error signal $E_p$ is input into the loop filter & integration module 205. Functionally, the filter and integration module acts to receive an error signal as its input and output a signal which is representative of the dividing factor M. It is analogous to a low-pass filter (LPF) used within a conventional PLL, for example LPF 102 in FIG. 1. In a conventional PLL with a VCO, the LPF converts an error signal output from a phase comparator into a voltage to be applied to the VCO for changing the oscillator frequency. With the exemplary implementation shown in FIG. 2, the filter and integration module 205 converts an error signal output from a digital comparator into a signal representative of a dividing factor M, where the dividing factor M is to be used to frequency divide the signal generated at the free-running oscillator in order to generate a signal frequency-tuned to a desired frequency $f_{wanted}$. Ideally, the value of M is chosen such that:

$$M = \frac{f_{gen}}{f_{wanted}} \quad (5)$$

If the value of M is given by equation (5) then it can be seen with reference to equation (4) that the frequency of the output signal will be equal to the desired frequency. The feedback loop 206 can adjust the value of M in dependence on the error signal such that the frequency of the output signal can match the desired frequency despite changes to the frequency of the generated signal $S_{gen}$.

In an exemplary configuration, the integrator could be configured to generate a dividing factor M in dependence on the error signal $E_p$ according to the following equation:

$$M_n = M_{n-1} + \alpha E_p \quad (6)$$

In equation 6, α is an integration factor whose value could be suitably chosen in dependence on the particular implementation of the circuit. The integrator could have any suitable design, and the value of the dividing factor could be generated from the error signal in any other suitable way.

Since the dividing factor is dependent upon the error signal, which itself is dependent upon the comparison of the reference signal and the feedback signal output from the counter, the digital word representative of the dividing factor could be relatively long if the error is known to a high accuracy. In practice, it may be difficult to frequency-divide a signal by a long digital word representative of a non-integer value. However, because the value of the dividing factor is used to tune the frequency of the output signal $S_{out}$, it will often be desirable for the dividing factor to be as accurate as possible.

One solution to this potential problem is to use a frequency divider unit that comprises an error shaper and a frequency divider. For example, divider unit 202 could comprise an error shaper 207 and divider 208. The divider 208 acts to divide the signal $S_{gen}$ output from the free-running oscillator by a factor N. The error shaper is configured to receive the digital word representative of M and to provide a divisor of value N to the divider 208. The error shaper rapidly varies the value of N provided to the divider such that over a discreet time period the average value of N is equal to M to within some margin of error. Alternatively, a noise shaper may be used instead of an error shaper.

Preferably, the value of N would be suitably chosen such that it is represented by a reduced length digital word compared to the value of M. With this configuration, each frequency dividing operation to frequency divide the signal $S_{gen}$ by a factor M would comprise multiple frequency divisions, wherein in each of these divisions the signal $S_{gen}$ is frequency divided by a factor N, where N is variable by the error shaper. The discreet time period over which the values of N average to a value of M within a margin of error could suitably be the time period taken for a signal to pass through the feedback loop 206, or alternatively the time period over which values of M are generated. For example, if a value of M is generated from an error signal every time period T, the values of N input into the divider 208 for a period T could be chosen such that they average to the value of M in use throughout that period to within a suitably small margin of error. With this exemplary implementation a frequency dividing operation would take time T and would comprise multiple frequency divisions of the signal $S_{gen}$.

The use of an error shaper within the frequency divider unit also has the advantage of being able to re-distribute noise to different parts of the frequency spectrum. For example, the error shaper may be suitably configured such that signal $S_{out}$ has a frequency spectrum with low noise levels near the frequency $f_{wanted}$ with increasing noise levels as the offset from $f_{wanted}$ increases. The higher frequency noise present in the signal $S_{out}$ can then be removed by a suitable form of filtering. An exemplary technique to remove this high frequency noise will be described in more detail with reference to FIG. 3.

In summary, the circuit shown in FIG. 2 operates to frequency-tune a signal generated at a signal generator to form an output signal as follows: The system in which the circuit is implemented knows the value of the clock signal frequency $f_{clock}$ and the desired output signal frequency $f_{wanted}$. These two values are used to form a reference signal. At the digital phase comparator, the value of the demand ($f_{wanted}/f_{ref}$) is compared with the feedback signal output from the digital counter. The digital counter increments with each passing rising edge of the output signal and the value held by the counter is output and cleared with each passing rising edge of the clock signal. The digital comparator outputs an error signal in dependence on the difference between the demand and the counter reading. This error signal is filtered through a low-pass filter and integrated to produce a digital control word representative of a dividing factor M. The dividing factor M is input to a divider unit such that the output signal from the divider unit is frequency-tuned to have an average frequency over a suitable time period equal to $f_{gen}/M$.

The nature of the feedback loop provides for the generation of an output signal with a frequency that tracks a desired frequency. If, for example, the output signal frequency is higher than the desired frequency, the output from the digital counter is higher than the demand. This could be because, for example, the frequency of the free-running oscillator drifts up. This results in a positive error signal being generated and the integrator generating a larger value of M (as can be seen, for example, with reference to equation 6 for a positive value of α). A larger value of M results in the signal $S_{gen}$ being frequency-divided by a larger value, which produces an output signal with a reduced frequency. Alternatively, if the output signal frequency is less than the desired frequency, the output from the digital counter is less than the demand. This results in a negative error signal being generated and the integrator generating a reduced value of M. A smaller value of M results in the signal $S_{gen}$ being frequency divided by a smaller value which generates an output signal with a higher frequency.

The circuit operates so that, over time, it generates a signal with a zero frequency error. It does this by generating an amount of phase at the output that is related to the amount of phase generated by the clock signal. For example, if the clock signal has a frequency of 32 KHz and the desired frequency is 640 MHz, then after a period of 100 seconds the clock signal has generated 3,200,000*2π radians of phase. The circuit will operate so that the total phase of the output signal after this time will be 64,000,000,000* 2π radians, i.e. over the time period there is a zero frequency error, because the demand will set the appropriate ratio(s).

Figure 3:
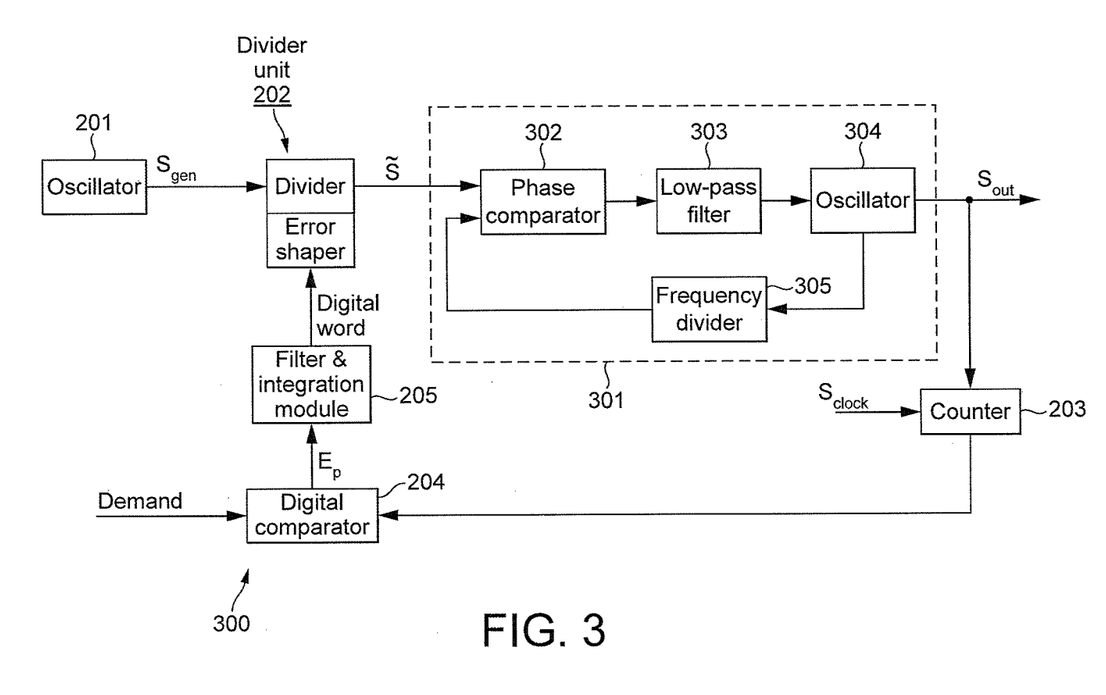
FIG. 3 is a block diagram of an alternative circuit for producing a frequency-tuned output signal.

As has been mentioned, an error shaper can be used to produce an output signal with a frequency spectrum that contains relatively low noise near the desired frequency with increased noise in the higher frequency parts of the spectrum. It may be desirable to filter the higher frequency noise components to produce a signal with relatively low noise across a wide band of its frequency spectrum. High frequency noise can be filtered through the use of a PLL. FIG. 3 shows an exemplary circuit in which a frequency-divided signal is passed through a PLL in order to filter high frequency noise components of that generated signal. The circuit shown in FIG. 3 contains a number of components that operate in substantially the same manner as components described with reference to FIG. 2. For clarity, these components have been labelled by the same reference numerals as the corresponding component in FIG. 2.

In FIG. 3, a circuit 300 comprises a free-running oscillator 201 that generates a signal $S_{gen}$ with frequency $f_{gen}$. The signal $S_{gen}$ is input into a divider unit 202 comprising a divider 208 and error shaper 207. The divider unit operates to frequency divide the signal $S_{gen}$ by a dividing factor M, where the value of M is determined by a loop filter and integration unit 205 in dependence on an error signal $E_P$ generated by a digital comparator 204. The signal output from the divider unit, $\tilde{S}$, is input into a PLL 301. The PLL may comprise, for example, a phase comparator 302, a low-pass filter 303, an oscillator 304 and a frequency divider 305. Alternatively, the PLL may comprise any suitable components for removing high-frequency noise from an input signal.

In this exemplary configuration, the divider 305 in the PLL is an integer divider that frequency divides signals by a factor K. The oscillator 304 outputs a signal $S_{out}$ which is input into a digital counter 203. The oscillator 304 could be any suitable oscillator, for example a ring oscillator, which advantageously uses a low current and generates moderately low levels of noise. The counter 203 could be configured to increment with each passing rising edge of signal $S_{out}$. In this case each passing rising edge of a clock signal causes the counter reading to be cleared and the value of the reading to be output as a digital feedback signal to a comparator 204. In an alternative implementation, the counter could be configured to increment with each passing edge of signal $S_{out}$. In this case, the counter reading is cleared with each passing edge of the clock signal. At the comparator the value of the counter reading is compared with the value of the demand and the difference between these two values is output as the error signal $E_p$. The error signal $E_p$ is input into a filter and integration module 205 to generate a digital control word representative of the dividing factor M. The dividing factor may be generated from the error signal in accordance with equation (6).

The insertion of a PLL between the divider unit 202 and digital counter 203 has the effect of altering the optimum value of M required to generate a signal with a frequency equal to the desired frequency $f_{wanted}$ for a particular value of $f_{gen}$. With the exemplary configuration shown in FIG. 2, the optimum value of M is given by equation (5). The presence of a frequency divider in the PLL means that the frequency of $\tilde{S}$ is related to the frequency of $S_{out}$ by the following equation:

$$f_{out} = K\tilde{f} \qquad (7)$$

In equation (7), $\tilde{f}$ is the frequency of signal $\tilde{S}$ and K is the dividing factor of the PLL frequency divider. The signal $S_{out}$ is the output signal of the circuit, and so it is desirable to tune the frequency of this signal to be equal to $f_{wanted}$. The frequency of signal $\tilde{S}$ is related to the frequency of the signal generated at the free-running oscillator by the following equation:

$$\tilde{f} = \frac{f_{gen}}{M} \quad (8)$$

Combining equations (7) and (8) leads to the following equation for the dividing factor:

$$M = K \cdot \frac{f_{gen}}{f_{out}} \quad (9)$$

Therefore for the frequency of the output signal to be equal to $f_{wanted}$, the dividing factor should take the value:

$$M = K \cdot \frac{f_{gen}}{f_{wanted}} \quad (10)$$

The value of M generated by the filter and integrator module 205 is input into the divider unit. The divider unit may comprise an error shaper 207 and a divider 208, where the error shaper and divider operate in the same manner as those discussed with reference to FIG. 2. Alternatively the divider unit could suitably comprise a noise shaper and a divider. The circuit shown in FIG. 3 operates to frequency divide a signal generated at a free-running oscillator by a value M which is continuously related to the value of $f_{gen}$ by equation 10. The circuit operates to frequency tune the generated signal to produce an output signal with a frequency $f_{wanted}$ by varying M to take account of any variations of $f_{gen}$. The PLL operates to remove high frequency noise to produce an output signal with relatively low noise across its frequency spectrum. Because the loop 401 is an integer loop, it can have a high bandwidth, enabling very flexible tradeoffs between filtering and response times.

Figure 4:
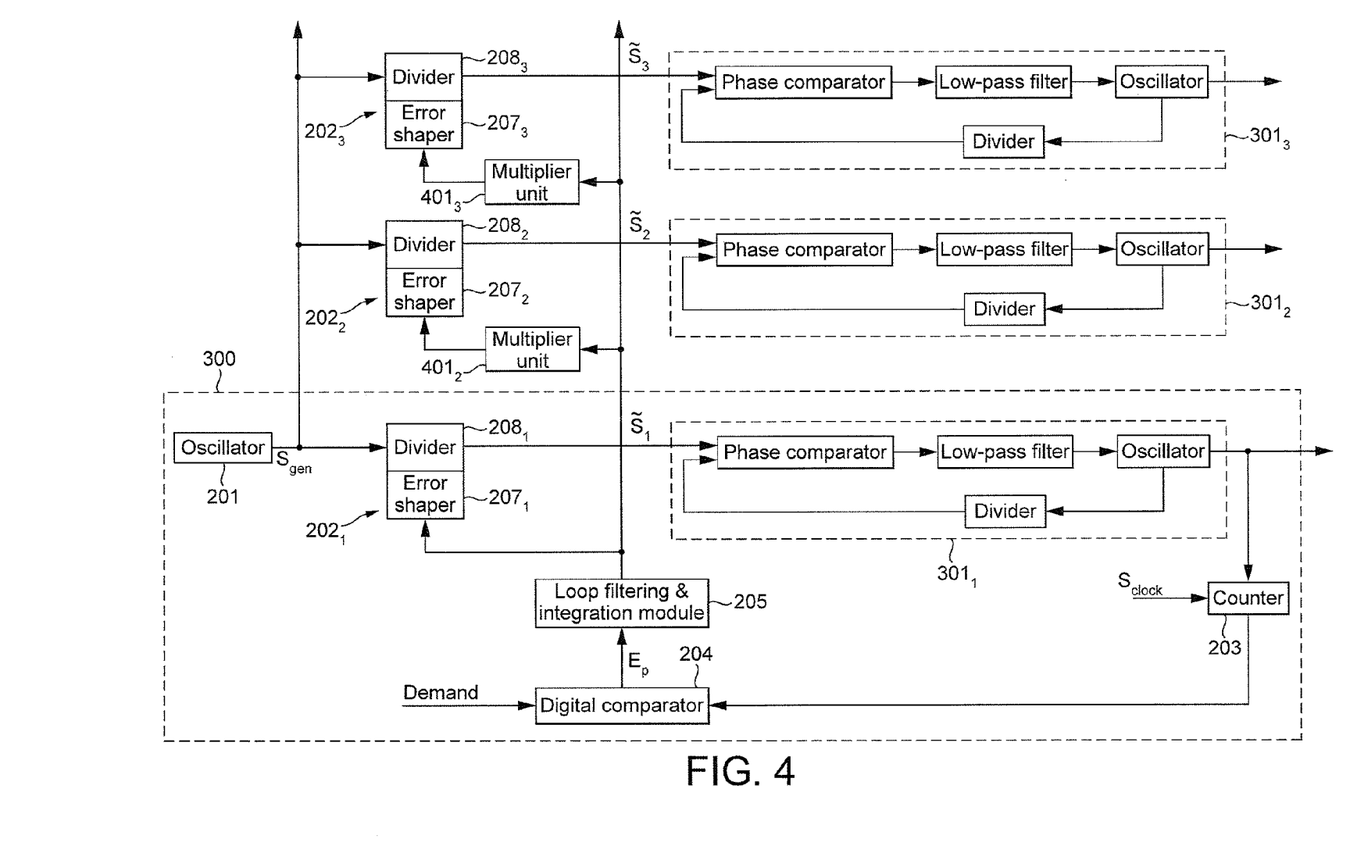
FIG. 4 is a block diagram of a circuit for producing a plurality of frequency-tuned output signals.

The dividing factor M can advantageously be used to generate multiple output signals at different frequencies. For example, the signal generated at the free-running oscillator can be input into multiple divider units where each divider unit comprises a divider and an error shaper. Dividing factors to be used by each of these divider units can be generated by multiplying the original dividing factor M by a suitable coefficient, and because M is digitally accurate all these outputs will be accurate In addition, the signals output from each of the divider units could be fed into a respective PLL to remove higher frequency noise. FIG. 4 shows a schematic diagram of an exemplary circuit used to generate multiple signals from a free-running oscillator. Components of the circuit shown in FIG. 4 that operate in substantially the same way as components previously described with reference to FIG. 2 or 3 will be labelled by the same reference numerals as used in those previous figures.

The exemplary circuit shown in FIG. 4 comprises a portion 300 that can operate in the manner described with reference to FIG. 3 so as to frequency-tune the generated signal to produce an output signal $S_{out,1}$ with a frequency equal to a desired frequency $f_{wanted,1}$. The circuit further comprises a plurality of: divider units $202_n$, PLLs $301_n$ and multiplier units $401_m$, where n=1, 2 ... N and m=2, ... N. N is equal to the number of output signals to be generated and could be any suitable value. The subscripts n and m denotes a particular branch of the circuit used for generating the n'th or m'th output signal. For example, n=2 denotes the components and signals for generating a $2^{nd}$ output signal with a particular desired frequency. In this exemplary configuration each of the PLLs $301_n$ comprises the same components as PLL 301 described with reference to FIG. 3. This is for illustrative purposes only; each of the PLLs $301_n$ could comprise any suitable components for removing higher frequency noise from an input signal. Furthermore each of the PLLs may comprise different sets of components.

In operation, the free-running oscillator 201 generates a signal $S_{gen}$. The signal $S_{gen}$ is input into each of the divider units $202_n$. Suitably, each of the divider units comprises an error shaper $207_n$ and a divider $208_n$. The portion 300 comprises a loop filter and integrator module 205 configured to generate a dividing factor $M_1$ in dependence on an error signal $E_p$. A digital control word representative of $M_1$ is input into error shaper $207_1$ and multiplier units $401_m$. Each multiplier unit $401_m$ digitally multiplies the dividing factor $M_1$ by a suitable coefficient $\eta_m$ to produce a new dividing factor $M_m$, given by:

$$M_m = \eta_m \cdot M_1 (m=2, \ldots N) \quad (11)$$

Each multiplier unit outputs the generated dividing factor $M_m$ into its respective error shaper $207_m$. The output of each of these error shapers is a signal $\tilde{S}_m$, which is input into a respective PLL $301_m$. Each of the PLLs $301_m$ comprises a frequency divider such that the frequency of the output signal of the PLL, denoted by $f_{out,m}$, is related to the frequency of the input signal of the PLL, $f_m$, by the following equation:

$$f_{out,m} = K_m \tilde{f}_m (m=2, \ldots N) \quad (12)$$

In equation (11) $K_m$ is the dividing factor for the divider in the PLL $301_m$. The values of the dividing factors may be the same for each of the PLLs. Alternatively, the values may be different for each PLL. Analogously to equation (10), in order to frequency-tune an output signal with a desired frequency $f_{wanted,n}$, the values of each of the dividing factors should be chosen so that:

$$M_n = K_n \cdot \frac{f_{gen}}{f_{wanted,n}} \quad (n = 1, 2, \ldots N) \quad (13)$$

Because the same signal $S_{gen}$ is input into each of the divider units $202_n$, a set of dividing factors that satisfy equation (13) can be generated simply by multiplying the dividing factor $M_1$ by a suitable coefficient $\eta_m$ such that $\eta_m$ satisfies:

$$\eta_m = \frac{K_m}{K_1} \cdot \frac{f_{wanted,1}}{f_{wanted,m}} \quad (14)$$

The set of values for $K_n$ and $f_{wanted,n}$ are known and fixed, which means the set of values for q are also known and fixed. This means that if the filter and integrator module 205 generates a value of $M_1$ that produces an output signal with a frequency $f_{wanted,1}$, the values of $M_m$ generated from $M_1$ in accordance with equations (11) and (14) will lead to the generation of a set of output signals each at the correct desired frequency $f_{wanted,m}$. The exemplary circuit shown in FIG. 4 can advantageously frequency-tune a single signal to generate a set of outputs signals, each at a desired frequency, from a single calculated dividing factor $M_1$.

A practical implementation of the circuit shown in FIG. 4 could be, for example, in a multi-radio chip for generating multiple carrier frequencies to be used by multiple radios. With this implementation, multiple low-noise carrier signals could be generated using a single high-quality oscillator (the free-running oscillator 201). Generating multiple frequency-tuned signals from one high-quality oscillator advantageously reduces power consumption and occupied chip area. Furthermore, if the free-running oscillators were, for example, LC oscillators, the use of a single oscillator minimises inductor-inductor coupling which can arise from multiple LC oscillators being within close proximity.

The exemplary circuits shown in FIGS. 2 to 4 are configured such that the loop dynamics are largely independent of the clock signal. For example, doubling the frequency $f_{clock}$ of the clock signal causes the value of the demand ($f_{wanted}/f_{clock}$) to halve. However, doubling the clock frequency causes the counter to output and clear its held value twice as frequently. The counter readings will therefore be on average half the value. The reduced values of the demand and the counter readings will be offset by the increased frequency with which the counter outputs a reading (e.g., twice as often if the frequency $f_{clock}$ is doubled) so that the rate of accumulation of an error signal remains constant, and largely independent of the value of the clock frequency. This has the advantage that the frequency of the clock signal need not be fixed and the clock signal could be generated by a time varying oscillator. Alternatively, the clock signal could be generated by a pseudo-random number generator (PRNG) provided that the associated demand values are capable of being generated with the particular digital implementation being used and that the sequence of numbers is accurately known.

A design constraint of the clock signal is that it generally has to be significantly higher than the loop bandwidth (up to the order of a factor of 100). The loop bandwidth is the bandwidth over which the loop has a gain with unity magnitude. Thus, in practice it may sometimes be necessary to change the clock signal frequency in order to cater for a change in the loop bandwidth. One way to alter the loop bandwidth is to control the value of α used by the filter and integrator unit 205 when generating the dividing factor M in accordance with equation (6). Suitably, if the feedback loop is implemented in the digital domain the value of α may be changed by means of software.

In a practical implementation, the circuits shown in FIGS. 2 to 4, or variations thereof, may be used in a Bluetooth radio. The Bluetooth radio may perform a periodic scan for other Bluetooth devices. This could be in the order of every second or so. When the Bluetooth device is performing a scan, it is important that the frequency of the signal output from the radio is tuned to a high accuracy as potential devices listening to the scan are doing so on a particular frequency only. Furthermore, the scan is typically only of a short duration (e.g. of the order of a millisecond). One way to facilitate the generation of an accurate signal during the scan is to use a high frequency clock. For example, if the clock signal is of the order of $KH_z$, the counter will output a reading in the order of every millisecond, meaning phase errors are determined at the comparator on a similar time frame. Since the duration of the scan is also of the order of a millisecond, it is possible that the output signal could contain a frequency error for the duration of, or a substantial part of, the scan. Increasing the order of magnitude of the clock signal frequency can alleviate this problem. In practice, increasing the frequency of the clock signal increases the power consumption of the circuit and this or other associated changes can cause on-chip heating. This on-chip heating can cause a frequency shift in the signal generated at the free-running oscillator. In order to ensure that this shift in frequency does not affect the ability of the circuit to frequency-tune the generated signal to a desired frequency, the bandwidth of the feedback loop may be increased for a suitable period of time, for example for the duration of the scan.

In certain practical implementations, e.g. generating signals for radio transmissions, the digital control word representative of the dividing factor may be modulated prior to being input into the divider unit. The digital word may suitably be phase modulated, or frequency modulated. In the exemplary circuit shown in FIG. 4, each of the generated dividing factors $M_n$ may be separately modulated prior to being input to the respective noise shaper so as to produce a set of frequency or phase modulated output signals from a single free-running oscillator. A dividing factor may be modulated by adding to it a suitable sinusoidal term, for example a $\sin(\omega t)$. This causes the frequency of the signal output from the divider unit to vary sinusoidally in time, i.e. the signal is frequency modulated. If a sinusoidal term is added to a dividing factor the average value of the dividing factor remains unchanged.

Figure 5:
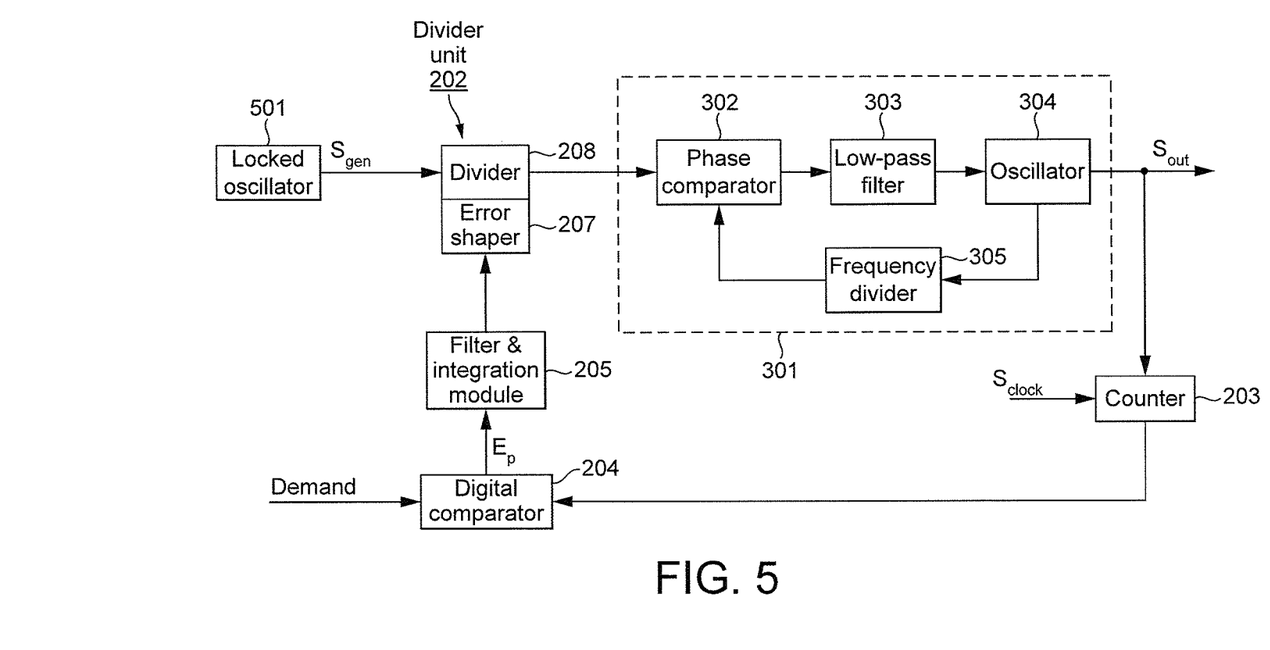
FIG. 5 is a block diagram of a circuit for producing a frequency-tuned output signal from a locked oscillator.

The apparatus and methods described with reference to FIGS. 2 to 4 could equally well be applied to locked signal generators. FIG. 5 shows a circuit where the output signal from a locked oscillator 501 is input into a feedback loop and frequency divided to produce a frequency-tuned output signal.

The circuit shown in FIG. 5 can still be used to generate multiple frequency-tuned signals from a single digital word and oscillator. In practice, the circuit shown in FIG. 5 may be used when the signal generator is operating within an unlicensed band of the frequency spectrum. As the number of licensed frequency bands increases, the width of an unlicensed part of the spectrum may decrease. A signal generator could be locked to ensure it does not generate a signal with a frequency in a part of the spectrum for which it does not have a licence.

The locked oscillator 501 could be locked by any suitable circuitry. This circuitry is omitted from FIG. 5 for the purposes of clarity and because the form of the circuitry is not pertinent to the invention. The locked oscillator 501 could represent, for example, a conventional PLL. The signal $S_{gen}$ output from the locked oscillator would then be the output signal from a conventional PLL. If the signal $S_{gen}$ is locked by some suitable external circuitry the output signal $S_{out}$ can still be tuned to a desired frequency using any of the methods described with reference to FIGS. 2 to 4. That is, the invention is equally applicable to signals that are frequency locked but has the advantage that it can be applied to signals generated from a signal generator with no tune line, i.e. to a free-running oscillator.

Figure 6:
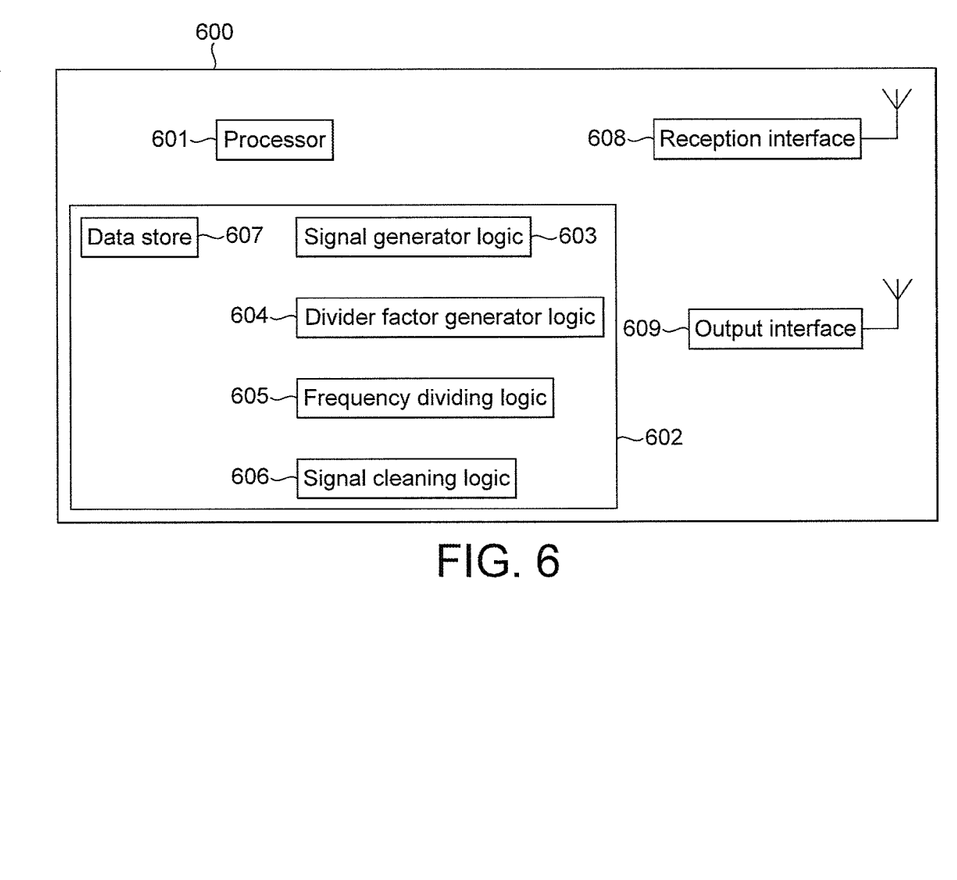
FIG. 6 is a block diagram of an exemplary computing based device in which the apparatus described with reference to FIGS. 2 to 5 could be implemented.

FIG. 6 illustrates a computing based device 600 in which the described apparatus for generating a frequency-tuned output signal can be implemented. The computing based device may be a wireless telecommunications device, for example a Bluetooth enabled device. The computing based device illustrates functionality used for generating an oscillating signal, generating an error signal from a comparison of two signals and performing a frequency-dividing operation.

Computing based device 600 comprises a processor 601 for processing computer executable instructions configured to control the operation of the device in order to generate an output signal (or set of output signals) with a desired frequency as described with reference to FIGS. 2 to 4. The computer executable instructions can be provided using any computer-readable media such as memory 602. Further software that can be provided at the computer-based device 600 includes error signal generator logic 603 which implements the step of generating an error signal in dependence on the comparison of two signals and divider factor generator logic 604 which implements the step of generating a suitable dividing factor in dependence on the error signal. Yet further pieces of logic that can be provided at the computer-based device 600 are frequency dividing logic 605 to implement the step of frequency dividing a signal by the generated dividing factor and signal cleaning logic 606 to implement the step of removing unwanted noise from the generated signal. Alternatively the error signal generator, divider factor generator, frequency divider and signal cleaner can be implemented partially or wholly in hardware. Data store 607 stores data such as the freely oscillating signal, values of generated dividing factors and a reference signal. Computing based device 600 further comprises a reception interface 608 for receiving data. Computing based device also comprises an output interface 609 for transmitting data.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of tuning the frequency of a generated signal to form an output signal comprising:
   forming the generated signal at a signal generator, wherein the signal generator has no inputs;
   comparing a feedback signal with a reference signal and generating a control signal in dependence on that comparison, wherein the feedback signal is generated using the output signal; and
   generating the output signal by performing a frequency-dividing operation in dependence on the generated signal and a dividing factor, wherein the dividing factor is determined in dependence on the control signal.

2. The method as claimed in claim 1, wherein the frequency dividing operation is performed by a divider unit.

3. The method as claimed in claim 2 wherein the control signal is input into the dividing unit to generate the dividing factor for use in the frequency dividing operation.

4. The method as claimed in claim 2, further comprising:
   modulating the control signal to generate a modulated control signal;
   inputting the modulated control signal into the divider unit;
   generating a dividing factor in dependence on the modulated control signal; and
   generating the output signal by performing the frequency dividing operation in dependence on the dividing factor, wherein the output signal is modulated.

5. The method as claimed in any of claim 1, wherein the feedback signal and the reference signal are compared and an error signal is generated in dependence on that comparison.

6. The method as claimed in claim 5 further comprising filtering and integrating the error signal to generate the control signal.

7. The method as claimed in claim 1, wherein the feedback signal is the output signal.

8. The method as claimed in claim 1, wherein the output signal generated by performing the frequency dividing operation has a frequency equal to the frequency of the generated signal divided by the dividing factor.

9. The method as claimed in claim 1 comprising:
   generating the output signal by performing the frequency dividing operation to generate a frequency-divided signal;
   inputting the frequency-divided signal into a phase locked loop (PLL); and
   forming the output signal at a signal generator within the phase-locked loop.

10. A method of tuning the frequency of a generated signal to form an output signal comprising:
    forming the generated signal at a signal generator;
    comparing a feedback signal with a reference signal and generating a control signal in dependence on that comparison, wherein the feedback signal is generated using the output signal; and
    generating the output signal by performing a frequency-dividing operation in dependence on the generated signal and a dividing factor, wherein the dividing factor is determined in dependence on the control signal;
    wherein the frequency dividing operation comprises performing a plurality of frequency divisions on the generated signal, wherein in each of the plurality of frequency divisions the generated signal is frequency divided by an intermediary value such that the average of the intermediary values for the frequency dividing operation is equal to the dividing factor.

11. A method of tuning the frequency of a generated signal to form an output signal comprising:
    forming the generated signal at a signal generator;
    comparing a feedback signal with a reference signal and generating a control signal in dependence on that comparison, wherein the feedback signal is generated using the output signal; and
    generating the output signal by performing a frequency-dividing operation in dependence on the generated signal and a dividing factor, wherein the dividing factor is determined in dependence on the control signal;
    wherein the frequency dividing operation is performed by a divider unit, and the divider unit comprises an error shaper.

12. A method of tuning the frequency of a generated signal to form an output signal comprising:
    forming the generated signal at a signal generator;
    comparing a feedback signal with a reference signal and generating a control signal in dependence on that comparison, wherein the feedback signal is generated using the output signal; and
    generating the output signal by performing a frequency-dividing operation in dependence on the generated signal and a dividing factor, wherein the dividing factor is determined in dependence on the control signal;
    wherein the frequency dividing operation is performed by a divider unit, and the divider unit comprises a noise shaper.

13. A method of tuning the frequency of a generated signal to form an output signal comprising:
    forming the generated signal at a signal generator;
    comparing a feedback signal with a reference signal and generating a control signal in dependence on that comparison, wherein the feedback signal is generated using the output signal;
    generating the output signal by performing a frequency-dividing operation in dependence on the generated signal and a dividing factor, wherein the dividing factor is determined in dependence on the control signal;
    generating the output signal by performing the frequency dividing operation to generate a frequency-divided signal;

inputting the frequency-divided signal into a phase locked loop (PLL); and forming the output signal at a signal generator within the phase-locked loop;

wherein the frequency-divided signal acts as the reference signal of the phase locked loop.

14. A method of tuning the frequency of a generated to form an output signal comprising:

forming the generated signal at a signal generator;

comparing a feedback signal with a reference signal and generating a control signal in dependence on that comparison, wherein the feedback signal is generated using the output signal;

generating the output signal by performing a frequency-dividing operation in dependence on the generated signal and a dividing factor, wherein the dividing factor is determined in dependence on the control signal; and generating a plurality of output signals, wherein each of the said plurality of output signals is generated by performing a respective frequency dividing operation in dependence on the generated signal and a respective dividing factor.

15. The method as claimed in claim 14, wherein the respective dividing factors for each of the plurality of output signals is determined in dependence on the control signal.

16. The method as claimed in claim 15, wherein the control signal is modified to produce a plurality of modified control signals and each of the plurality of the modified control signals is modulated and input into a respective divider unit to generate the respective dividing factor.

17. The method as claimed in any of claim 14 wherein each of the said plurality of output signals has a frequency equal to the generated signal divided by the respective dividing factor.

18. The method as claimed in any of claim 14 comprising:

generating a plurality of output signals, wherein each of the said plurality of output signals is generated by performing a respective frequency dividing operation;

inputting each of the respective frequency divided signals into a respective phase locked loop; and forming each of the said plurality of output signals at a signal generator within the respective phase locked loop.

19. An apparatus for frequency tuning a generated signal to form an output signal comprising:

a signal generator arranged to output the generated signal;

a comparison unit arranged to compare a feedback signal with a reference signal and further arranged to generate an error signal in dependence on the comparison, wherein the feedback signal is dependent upon the output signal;

a frequency-divider unit arranged to perform a frequency dividing operation for generating the output signal in dependence on the generated signal and a dividing factor, wherein the dividing factor is dependent upon the error signal; and a plurality of frequency-divider units for generating a plurality of output signals, wherein each of the plurality of frequency-divider units is configured to perform a frequency-dividing operation for generating one of the said plurality of output signals in dependence on the generated signal and a respective dividing factor, where each of the respective dividing factors is dependent on the error signal.

20. The apparatus as claimed in claim 19 wherein the divider unit is arranged to:

perform the frequency dividing operation for generating the output signal to generate a frequency-divided signal; and input the frequency-divided signal into a phase locked loop, wherein the phase locked loop comprises a signal generator configured to generate the output signal.

* * * * *

UNITED STATES PATENT AND TRADEMARK OFFICE
CERTIFICATE OF CORRECTION

PATENT NO. : 8,803,574 B2
APPLICATION NO. : 13/693280
DATED : August 12, 2014
INVENTOR(S) : McLeod et al.

Page 1 of 1

It is certified that error appears in the above-identified patent and that said Letters Patent is hereby corrected as shown below:

In the Claims

Column 17, Line 30, In Claim 17, delete "in any of" and insert -- in --, therefor.

Column 17, Line 33, in Claim 18, delete "in any of" and insert -- in --, therefor.

Signed and Sealed this
Tenth Day of February, 2015

Michelle K. Lee
*Deputy Director of the United States Patent and Trademark Office*